Figure 1A:
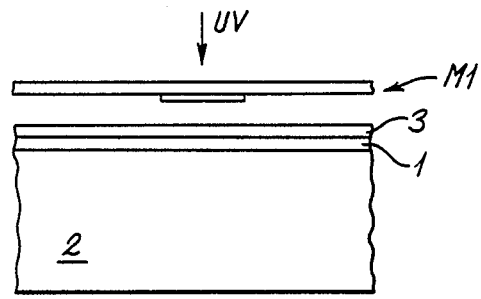
Figure 1B:
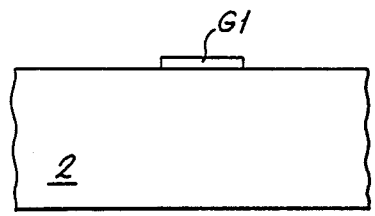
Figure 1C:
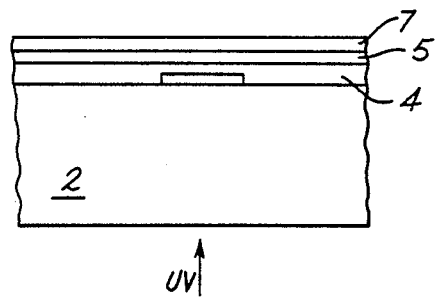
Figure 1D:
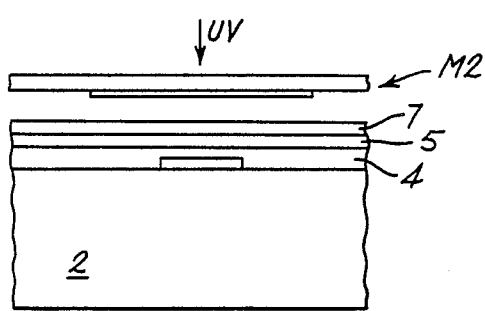

United States Patent [19]

Wright et al.

[11] Patent Number: 4,968,638
[45] Date of Patent: Nov. 6, 1990

[54] SEMICONDUCTOR DEVICES

[75] Inventors: Stephen W. Wright, Berkhampstead; Charles P. Judge, London; Michael J. Lee, High Wycombe, all of England

[73] Assignee: National Research Development Corporation, London, England

[21] Appl. No.: 239,646

[22] Filed: Sep. 2, 1988

[30] Foreign Application Priority Data

Sep. 9, 1987 [GB] United Kingdom ............... 8721193

[51] Int. Cl.$^5$ ........................................... H01L 21/265
[52] U.S. Cl. ....................................... 437/41; 437/40; 437/229; 357/23.7; 148/DIG. 106
[58] Field of Search .................. 357/23.7; 437/40, 41, 437/229; 148/DIG. 106

[56] References Cited

FOREIGN PATENT DOCUMENTS 0071244 2/1983 European Pat. Off. .
0090661 10/1983 European Pat. Off. .

Primary Examiner—Olik Chaudhuri
Assistant Examiner—M. Wilczewski
Attorney, Agent, or Firm—Cushman, Darby & Cushman

[57] ABSTRACT

A method of manufacture of thin film, field-effect transistors formed on a transparent substrate and with transparent, conductive source and drain electrodes, uses initially deposited gate electrodes as a mask in association with photolithographic processing using radiation transmitted through the substrate and electrodes to minimize parasitic capacitance between the gate and source and drain electrodes.

2 Claims, 3 Drawing Sheets

SEMICONDUCTOR DEVICES

This invention relates to semiconductor devices and methods of manufacture thereof. In particular, it is concerned with the fabrication of thin film transistors having a pair of gate electrodes disposed about a channel region.

In the fabrication of semiconductor devices, it is usual to produce an array of devices on a substrate, which may be composed of the semiconductor itself or may be an insulating support for active materials which are deposited as thin films on the surface of the substrate. Active devices comprise a plurality of regions having different conducting properties to which conductive electrodes are applied.

Hitherto, it has been customary to employ photolithographic methods to define the electrodes and/or the active areas of the devices. Difficulties arise because, either due to misalignment of successive masks, or to variations in dimensional tolerance of successive masks, overlap of electrodes occurs. Because of the conductive nature of the electrodes, a parasitic capacitance will exist between them and this will, in general have the effect of degrading the performance of the semiconductor device. It is therefore an object of this invention to present a method of manufacture of semiconductor devices having reduced parasitic capacitance.

According to one aspect of the present invention there is provided a method of manufacture of semiconductor devices comprising the steps of depositing on the surface of a transparent insulating substrate a first layer of conductive material adapted to form a first plurality of gate electrodes, depositing over said first layer of conductive material, a first layer of transparent insulating material, forming on the exposed surface of said first layer of insulating material a plurality of pairs of conductive contacts having gaps therebetween defined by photolithography involving exposure to radiation through said transparent insulation substrate using said first plurality of gate electrodes as a mask, depositing a layer of semiconductive material to form a semiconductive path between said pairs of conductive contacts.

According to a further aspect of the present invention there is provided a method of manufacture of semiconductor devices comprising the steps of depositing on the surface of a transparent insulating substrate a first layer of conductive material adapted to form a first plurality of gate electrodes, depositing over said first layer of conductive material, a first layer of transparent insulating material, forming on the exposed surface of said first layer of insulating material a plurality of pairs of conductive contacts having gaps therebetween defined by photolithography involving exposure to radiation through said transparent insulation substrate using said first plurality of gate electrodes as a mask, depositing a layer of semiconductive material to form a semiconductive path between said pairs of conductive contacts, further depositing over said layer of semiconductive material and said conductive contacts a second layer of transparent insulating material, and depositing on said second layer of transparent insulating material a second plurality of gate electrodes having an area defined by photolithography involving exposure to radiation through said transparent insulation substrate using said first plurality of gate electrodes as a mask.

The layer of semiconductive material may be deposited either before or after the conductive contacts.

There is also provided a field-effect device comprising a channel region of semiconductor material having a pair of transparent conductive contacts thereto and a pair of gate electrodes positioned on opposite sides of said channel region each of said gate electrodes being insulated therefrom by a layer of insulating material wherein the edge adjoining said channel region of each of said electrodes is substantially coplanar with the corresponding edges of said gate electrodes.

Figure 1E:
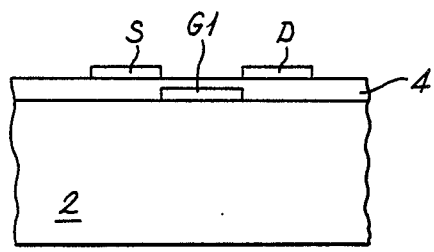
Figure 1F:
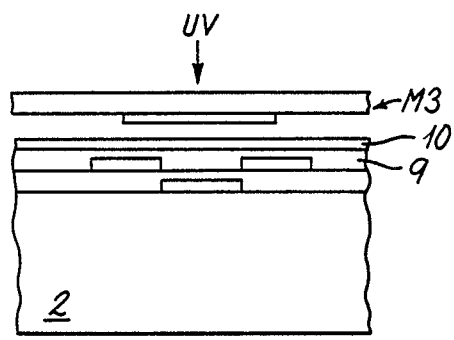
Figure 1G:
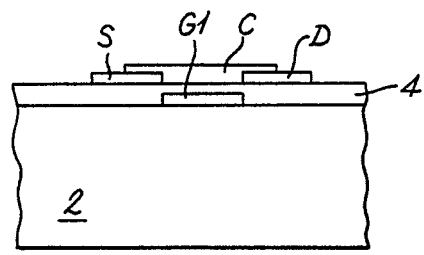
Figure 1H:
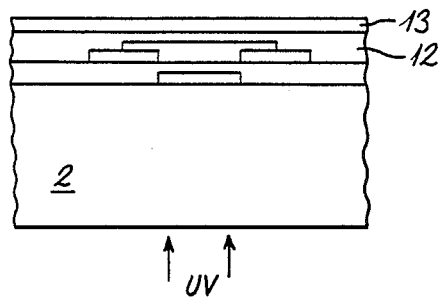
Figure 1I:
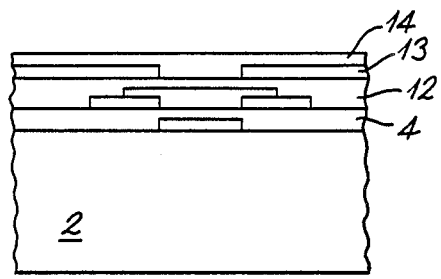
Figure 1J:
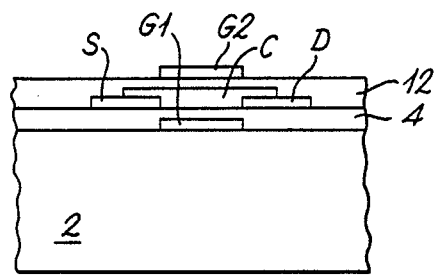
Figure 2:
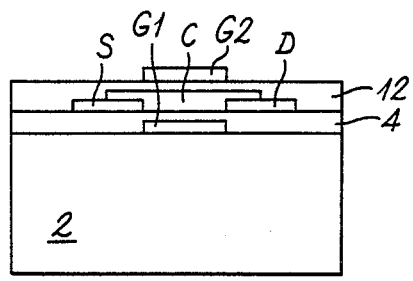

An embodiment of the invention will now be particularly described with reference to the accompanying drawings in which:

FIG. 1a to j shows schematically a series of steps in the fabrication of devices, FIG. 2 is a diagrammatic cross-section of a double-gate thin film transistor in accordance with the invention.

Referring now to the drawings, a layer of chromium 1 is deposited in vacuo on to a transparent glass substrate 2. A layer of photoresist 3 is spun on to the chromium and exposed to ultra-violet radiation UV through a mask M1. The resist is developed and the chromium selectively etched leaving an array of gate electrodes G1. (FIG. 1b) An insulating layer of silicon dioxide 4 followed by a layer of a transparent, conductive material such as indium/tin oxide 5 is then deposited on to the substrate. This is then covered with a further layer of photoresist 7 which is exposed to ultra-violet radiation through the substrate such that on development the photoresist is removed over the area of the opaque gate electrodes. The exposed conductive area is etched. (FIG. 1c) To define the actual area of contact between the semiconductor and the transparent conductor the substrate is coated with photoresist exposed through a suitable mask M2 from the front of the substrate developed and etched. This mask does not have to be accurately located as the critical source-drain gap has already been defined. (FIG. 1e)

The substrate is then heat-treated in a hydrogen-nitrogen ambient to render the indium/tin oxide layer highly conductive.

A layer of cadmium selenide 9 and a further layer of photoresist 10 is deposited on to the insulator 4 and the defined contacts 5 on the substrate 2. This photoresist is exposed to ultra-violet radiation UV through another non-critical mask M3. (FIG. 1f) After development, the cadmium selenide layer is etched to form channel regions C. (FIG. 1g) A second insulating layer of silicon dioxide 12 and yet another layer of photoresist 13 are deposited and exposed to ultra-violet radiation UV through the substrate.

Both the cadmium selenide and the indium/tin oxide layers are transparent to ultra-violet radiation, but the first gate array acts as mask, so that when the resist is developed, windows corresponding exactly to the pattern of the first gate array are formed. A layer 14 of nickel is then deposited and the remaining photoresist removed leaving a second gate array G2 of exactly the same dimensions as those of the first gate array G1. (FIG. 1j)

It will be apparent to those skilled in the art that various modifications may be made without departing from the ambit of the invention. For example, the method of exposure of photoresist through the transparent substrate using the opaque patterns deposited thereon as a mask to achieve precise alignment and minimum parasitic capacitance may be used to produce devices with only one gate electrode. The second gate electrode need not have any electrical effect and may serve simply for optical screening of the photosensitive channel region. The semiconductor material used for the device is preferably a II-VI compound, but other materials suitable for thin film transistor fabrication may be used. Other materials may be used for the electrodes.

We claim:

1. A method of manufacture of semiconductor devices comprising the steps of depositing on the surface of a transparent insulating substrate a first layer of conductive material adapted to form a first plurality of gate electrodes, depositing over said first layer of conductive material, a first layer of transparent insulating material, forming on the exposed surface of said first layer of insulating material a plurality of pairs of conductive contacts having gaps therebetween defined by photolithography involving exposure to radiation through said transparent insulation substrate using said first plurality of gate electrodes as a mask, depositing a layer of semiconductive material to form a semiconductive path between said pairs of conductive contacts, further depositing over said layer of semiconductive material and said conductive contacts a second layer of transparent insulating material, and depositing on said second layer of transparent insulating material a second plurality of gate electrodes having an area defined by photolithography involving exposure to radiation through said transparent insulation substrate using said first plurality of gate electrodes as a mask.

2. A method of manufacture of semiconductor devices according to claim 1 including the further step of heat-treating the substrate to render the material of said pairs of electrodes conductive.

* * * * *